(12) United States Patent
Chao

(10) Patent No.: US 10,523,228 B1
(45) Date of Patent: Dec. 31, 2019

(54) METHOD OF CAPACITIVE DAC CALIBRATION FOR SAR ADC

(71) Applicant: IPGREAT INCORPORATED, Grand Cayman (KY)

(72) Inventor: Yuan-Ju Chao, Cupertino, CA (US)

(73) Assignee: IPGREAT INCORPORATED, Grand Cayman (*) Notice: Subject to any disclaimer, the term of this patent is extended or adjusted under 35 U.S.C. 154(b) by 0 days.

(21) Appl. No.: 16/224,344

(22) Filed: Dec. 18, 2018

(51) Int. Cl.
*H03M 1/10* (2006.01)

(52) U.S. Cl.
CPC ........ *H03M 1/1033* (2013.01); *H03M 1/1047* (2013.01)

(58) Field of Classification Search
CPC .......... H03M 1/468; H03M 1/12; H03M 1/46; H03M 1/00; H03M 1/38; H03M 1/462; H03M 1/06; H03M 1/1009
USPC .................................. 341/118–121, 155, 172
See application file for complete search history.

(56) References Cited

U.S. PATENT DOCUMENTS

| | | | | |
|---|---|---|---|---|
| 6,084,538 | A * | 7/2000 | Kostelnik | H03K 5/2481 341/118 |
| 10,038,453 | B1 * | 7/2018 | George | H03M 1/802 |
| 10,243,577 | B1 * | 3/2019 | Berens | H03M 1/1047 |
| 2010/0079325 | A1 * | 4/2010 | Berens | H03M 1/007 341/145 |
| 2011/0122006 | A1 * | 5/2011 | Liao | H03M 1/1047 341/120 |
| 2013/0044014 | A1 * | 2/2013 | Lin | H03M 1/1061 341/110 |
| 2013/0088375 | A1 * | 4/2013 | Wu | H03M 1/1047 341/120 |
| 2013/0113638 | A1 * | 5/2013 | Chen | H03M 1/1061 341/110 |
| 2014/0253351 | A1 * | 9/2014 | Kumar | H03M 1/0617 341/118 |
| 2017/0093418 | A1 * | 3/2017 | Baek | H03M 1/466 |
| 2018/0167078 | A1 * | 6/2018 | Ding | H03M 1/1033 |
| 2018/0254779 | A1 * | 9/2018 | Omran | G01D 5/24 |
| 2018/0263756 | A1 * | 9/2018 | Shiuey | A61F 2/142 |

* cited by examiner

*Primary Examiner* — Linh V Nguyen
(74) *Attorney, Agent, or Firm* — Tran & Associates

(57) ABSTRACT

Systems and methods are disclosed for Successive Approximation Register Analog-to-Digital Converter (SAR ADC) by coupling an ADC capacitive network coupled to a comparator; and performing binary search using a comparator output using a capacitive DAC calibration process to enhance SAR ADC linearity and performance. In one implementation, the calibration process starts with the least significant bit (LSB) capacitor calibration then proceed to higher bit capacitors until all the capacitors are calibrated. Each capacitor consists of fixed-value base capacitor and value-adjustable capacitor. The capacitor calibration logic is implemented based on the process then incorporated into SAR ADC. ADC performs capacitor calibration first before normal conversion operation. The non-ideal aspect of normal conversion operation is preserved and accounted during capacitor calibration. By employing capacitor calibration, the DAC capacitor value can be minimal to enhance settling and conversion rate, SAR ADC performance is improved.

20 Claims, 11 Drawing Sheets

Cap C[0] calibration

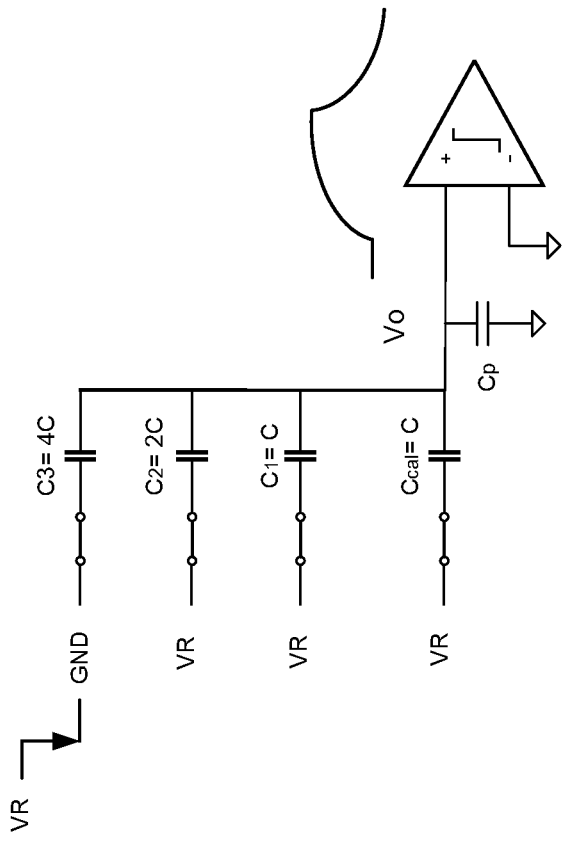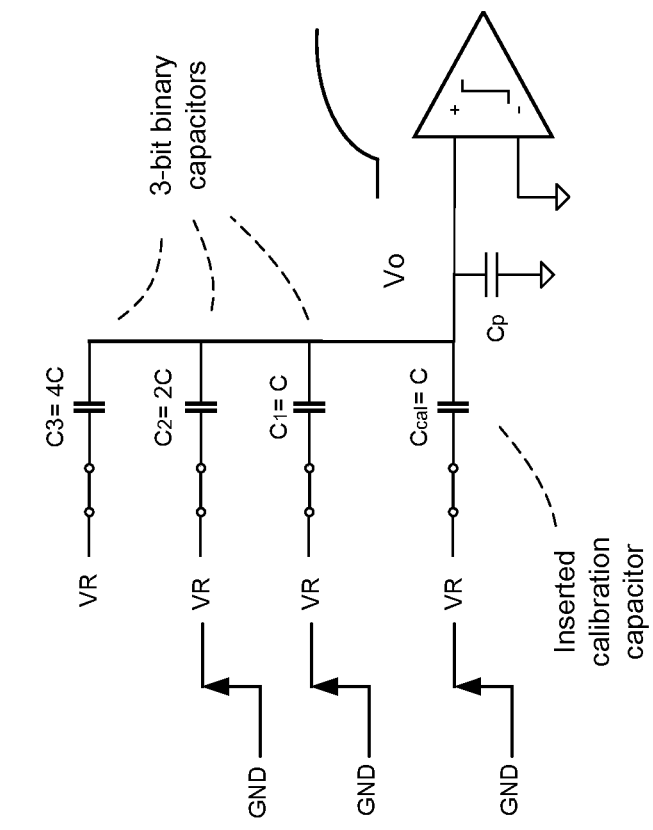
FIG. 3

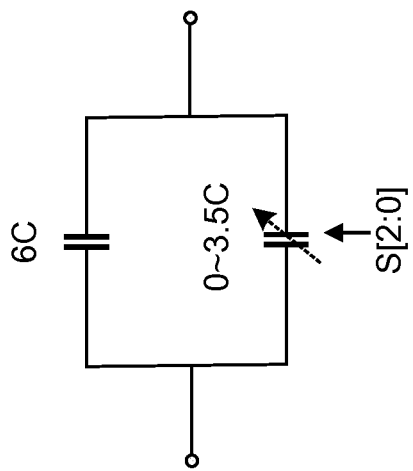
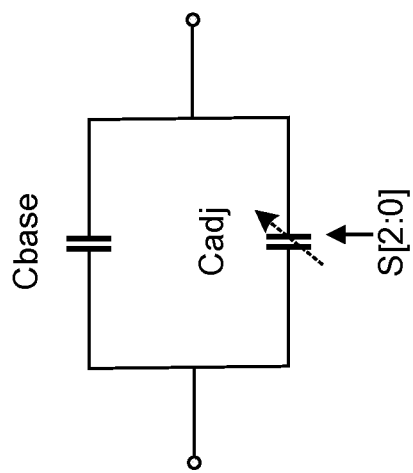
FIG. 5

METHOD OF CAPACITIVE DAC CALIBRATION FOR SAR ADC

FIELD OF THE INVENTION

The present invention relates to a successive approximation register (SAR) analog-to-digital converter (ADC).

BACKGROUND OF THE INVENTION

FIG. 1 shows the block diagram of N-bit Successive Approximation Register Analog-Digital Converter (SAR ADC) comprising Track/Hold, Comparator, N-bit DAC and Binary Search Logic. The analog input voltage $V_{IN}$ is sampled and held by Track/Hold. The Binary Search Logic is initially set to midscale (100 . . . 00). This forces the DAC output $V_{DAC}$ to be VR/2, where VR is the reference voltage of ADC. The Comparator compares $V_{IN}$ and $V_{DAC}$ and determines the next operation based on the comparator result. If $V_{IN}$ is greater than $V_{DAC}$, the comparator output is logic high and the most significant bit (MSB) of N-bit register remains at 1. Conversely, if $V_{IN}$ is less than $V_{DAC}$, the comparator output is logic low and the MSB is cleared to logic 0. This binary-search process proceeds to the next MSB-1 bit test and completes the conversion once the least significant bit (LSB) output is obtained.

Capacitive DAC is often used to implement N-bit DAC owing to its inherent track/hold function. Therefore, both Track/Hold and DAC functions can be fulfilled using capacitive DAC. A capacitive DAC consists of an array of capacitors with binary or non-binary weighted values. It employs the principle of charge redistribution to generate an analog output voltage during the binary search process. FIG. 2 shows the exemplary implementation of 14-bit SARADC using 14-bit binary weighted capacitive DAC. During the sample phase, all the switches are connected to the input $V_{IN}$. $V_{IN}$ voltage is effectively sampled and stored on the capacitors. As the first step of binary-search process begins, the bottom plate of MSB capacitor is connected to reference voltage VR. This drives the voltage of comparator inputs by an amount of 0.5VR. The comparator strobes and the comparator output value is stored. As the binary-search process continues, the next smaller capacitor is connected to VR. The conversion is complete once all the DAC capacitors are exercised. The relationship of $V_{IN}$ and SAR ADC digital output is described by the following equation:

$$V_{IN} = B13 * \frac{VR}{2} + B12 * \frac{VR}{4} + \ldots + B1 * \frac{VR}{8192} + B0 * \frac{VR}{16384}$$

$V_{IN}$ is the ADC input voltage $B[13:0]$ is ADC digital outputs $VR$ is ADC reference voltage When capacitive DAC is employed in the SAR ADC, the linearity of ADC is dictated by the capacitive DAC linearity. The mismatch between capacitors is the main source of non-linearity of capacitive DAC. For faster DAC settling, it is favorable to use smaller capacitor value. However, the mismatch gets worse as the capacitor dimension gets smaller.

SUMMARY

In a first aspect, systems and methods are disclosed for Successive Approximation Register Analog-to-Digital Converter (SAR ADC) by coupling an ADC capacitive network coupled to a comparator; and performing binary search using a comparator output using a capacitive DAC calibration process to enhance SAR ADC linearity and performance.

In a second aspect, a Successive Approximation Register Analog-Digital Converter (SAR ADC), including a capacitive DAC calibration process or algorithm to correct the capacitor DAC mismatch due to process. A calibration capacitor $C_{cal}$ is inserted to the DAC to facilitate the calibration. The calibration method takes advantage of binary weighted capacitor characteristic. Each capacitor consists of fixed-value base capacitor and value-adjustable capacitor in parallel. The capacitor calibration range and calibration step is controlled by the adjustable capacitor. Capacitive DAC calibration process starts with the least significant bit (LSB) capacitor calibration then advances to higher bit capacitors until MSB capacitor is calibrated. The capacitor on calibration is set to the minimum value initially then is increased incrementally until its value is found by strobing the comparator. The insertion of calibration logic does not alter the configuration of normal binary search conversion. The process mismatch of capacitor is corrected after the capacitor calibration and superior linearity is achieved.

In another aspect, a method to perform capacitive DAC calibration for Successive Approximation data conversion coupled with capacitive DAC calibration process to achieve favorable linearity.

Advantages of the SAR ADC may include one or more of the following. By calibrating the capacitors, the capacitor value can be minimal and good linearity is achieved with faster settling time. The capacitive DAC calibration process of SAR ADC takes advantage of the binary capacitor characteristic to perform the calibration. It does not modify any configuration of capacitive DAC and switch network so the parasitic and non-ideal aspect is preserved and accounted by the calibration process. After the calibration, the capacitive DAC linearity is improved and ADC performance is enhanced.

A more complete appreciation of the present invention and its improvements can be obtained by reference to the accompanying drawings, which are briefly summarized below, to the following detailed description of illustrative embodiment of the invention, and to the appended claims.

BRIEF DESCRIPTION OF THE DRAWINGS

FIG. 3 is a conceptual diagram of the proposed capacitive DAC calibration process.

FIG. 5 shows the individual capacitor implementation of capacitor calibration process.

DETAILED DESCRIPTION

Figure 1:
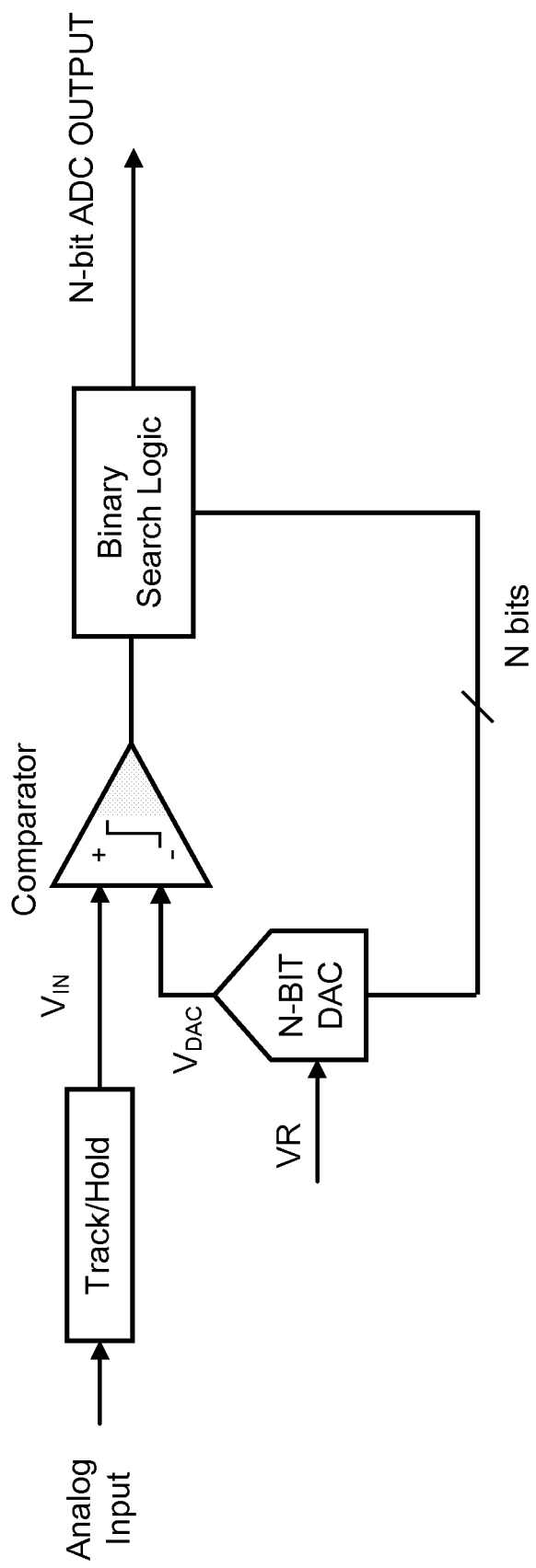
FIG. 1 illustrates the block diagram of N-bit SAR ADC.
Figure 2:
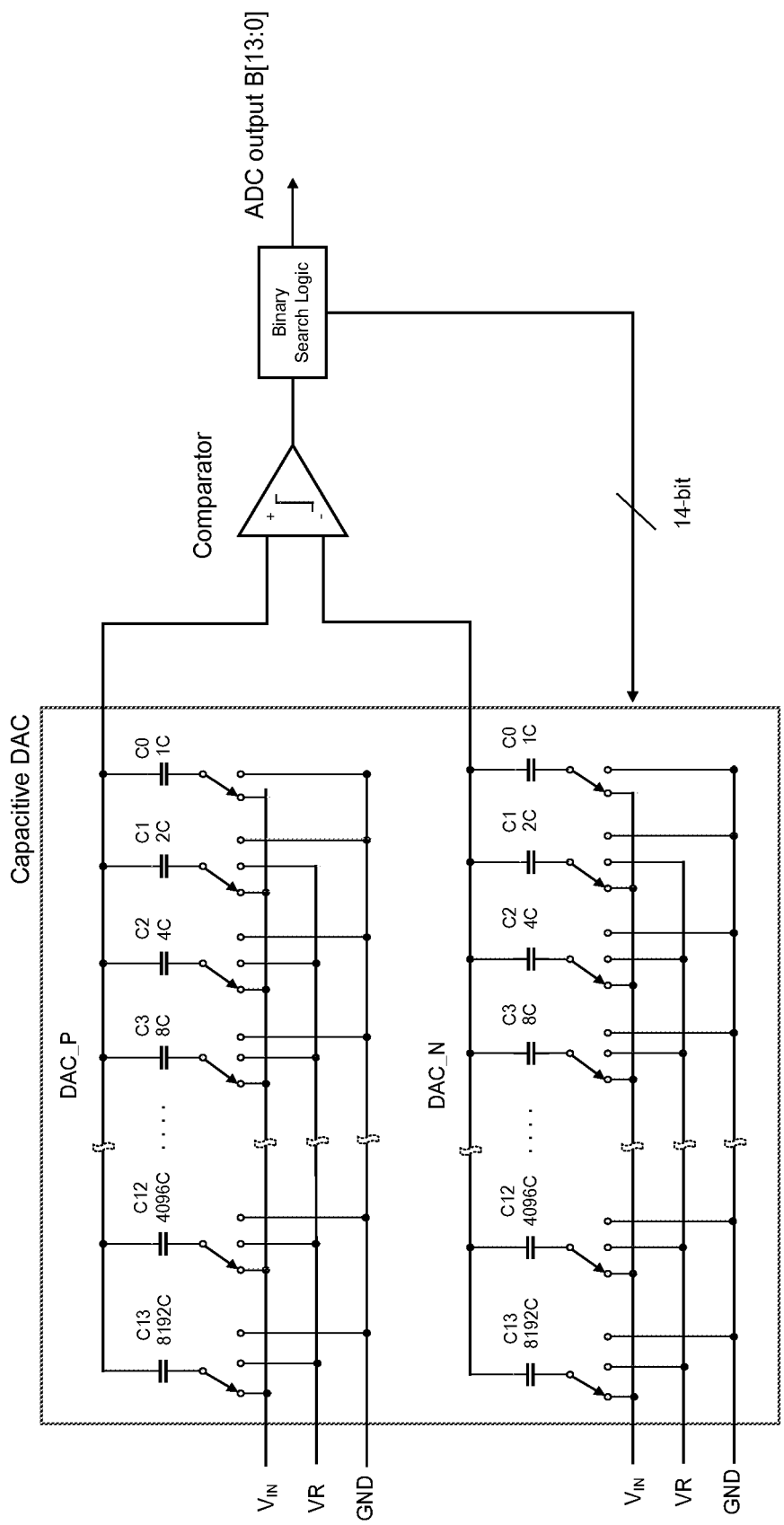
FIG. 2 is the implementation of 14-bit SAR ADC using 14-bit binary capacitive DAC.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Systems and methods are disclosed to perform capacitive DAC calibration for Successive Approximation data conversion coupled with capacitive DAC calibration process to achieve favorable linearity. In one embodiment, a Successive Approximation Register Analog-Digital Converter (SAR ADC), includes a capacitive DAC calibration process or algorithm to correct the capacitor DAC mismatch due to process. A calibration capacitor $C_{cal}$ is inserted to the DAC to facilitate the calibration. The calibration method takes advantage of binary weighted capacitor characteristic. Each capacitor consists of fixed-value base capacitor and value-adjustable capacitor in parallel. The capacitor calibration range and calibration step is controlled by the adjustable capacitor. Capacitive DAC calibration process starts with the least significant bit (LSB) capacitor calibration then advances to higher bit capacitors until MSB capacitor is calibrated. The capacitor on calibration is set to the minimum value initially then is increased incrementally until its value is found by strobing the comparator. The insertion of calibration logic does not alter the configuration of normal binary search conversion. The process mismatch of capacitor is corrected after the capacitor calibration and superior linearity is achieved.

FIG. 3 presents an exemplary diagram of the proposed capacitive DAC calibration process and method. It consists of three binary capacitors C3, C2 and C1 with their ideal values of 4C, 2C and 1C respectively. Additional calibration capacitor $C_{cal}$ with the same value of C1 is inserted to the binary capacitive DAC. The right end of capacitors are all coupled together and connected to a comparator. The other end of capacitors is connected to either reference VR or ground GND. Capacitor Cp represents the parasitic capacitance on comparator input Vo. By adding calibration capacitor $C_{cal}$, the most significant bit (MSB) capacitor C3 value will be exactly the sum of the lower bit capacitors including C2, C1 and $C_{cal}$. The capacitor calibration comprises two steps. The first step is to assert C2, C1 and $C_{cal}$ from GND to VR while C3 is coupled to VR. This results in a voltage increase on comparator input node Vo. The increase of Vo voltage is described by the equation:

$$VR * \frac{C_2 + C_1 + C_{cal}}{C_{total}} \quad (1)$$

$VR$ is $ADC$ reference voltage $C_{total} = C_3 + C_2 + C_1 + C_{cal} + C_p$

The second step is to de-assert C3 from VR to GND while C2, C1 and $C_{cal}$ remains the connection to VR. This results in a voltage decrease on comparator input Vo. The decrease of voltage is described by the equation:

$$VR * \frac{C_3}{C_{total}} \quad (2)$$

Once the voltage response of step 2 is complete, comparator input Vo voltage is the subtraction of equation 3 from equation 2, described as $$VR * \frac{C_2 + C_1 + C_{cal}}{C_{total}} - VR * \frac{C_3}{C_{total}} \quad (3)$$

For the condition of no capacitance mismatch, C3, C2, C1 and $C_{cal}$ appears as ideal capacitance value of 4C, 2C, 1C and 1C respectively. Capacitor C3 value is the exact sum of capacitors C2, C1 and $C_{cal}$, this leads to outcome of zero for the equation (3). With the insertion of calibration capacitor $C_{cal}$, the MSB capacitance equals the sum of lower bit capacitance. This characteristic of binary capacitor appears a simple equation form and is advantageous for capacitor calibration. In the scenario that C3 value is smaller than sum of capacitors C2, C1 and $C_{cal}$, the comparator input Vo is higher and the comparator output is logic high. Conversely, if C3 value is greater than the sum of C2, C1 and $C_{cal}$, the comparator output is logic low. The comparator output is a direction indication of capacitance difference between C3 and the sum of C2, C1 and $C_{cal}$. By constructing the capacitor with fine adjustable step, the capacitor value can be found and tuned to specified value by observing the comparator output.

Figure 4:
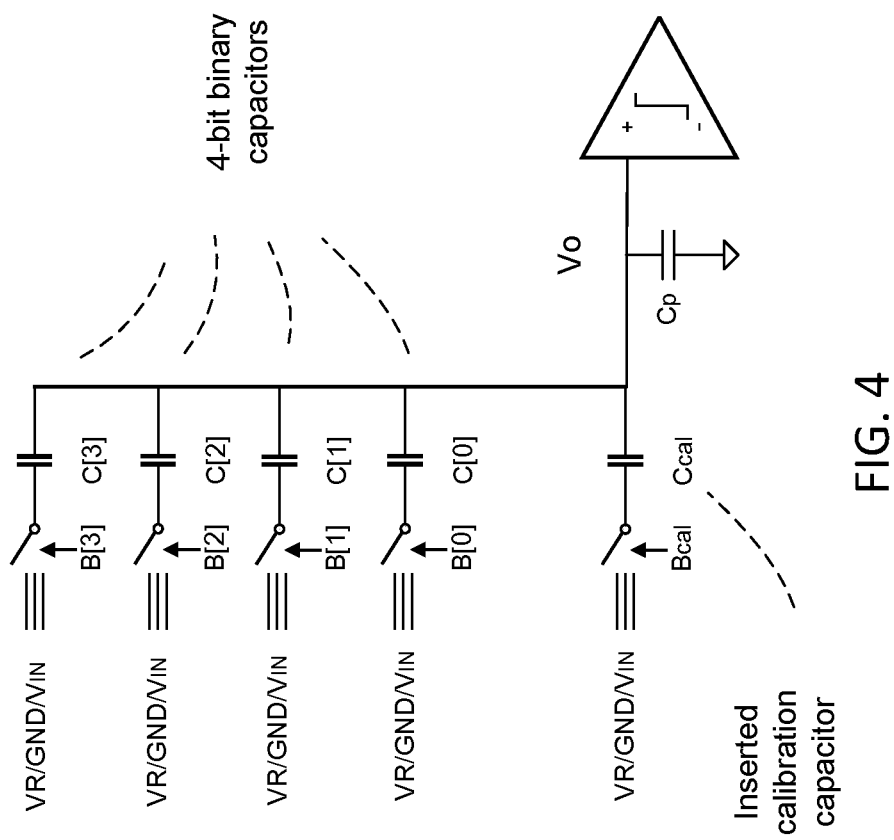
FIG. 4 shows 4-bit capacitor DAC of proposed capacitive DAC calibration process.
Figure 6:
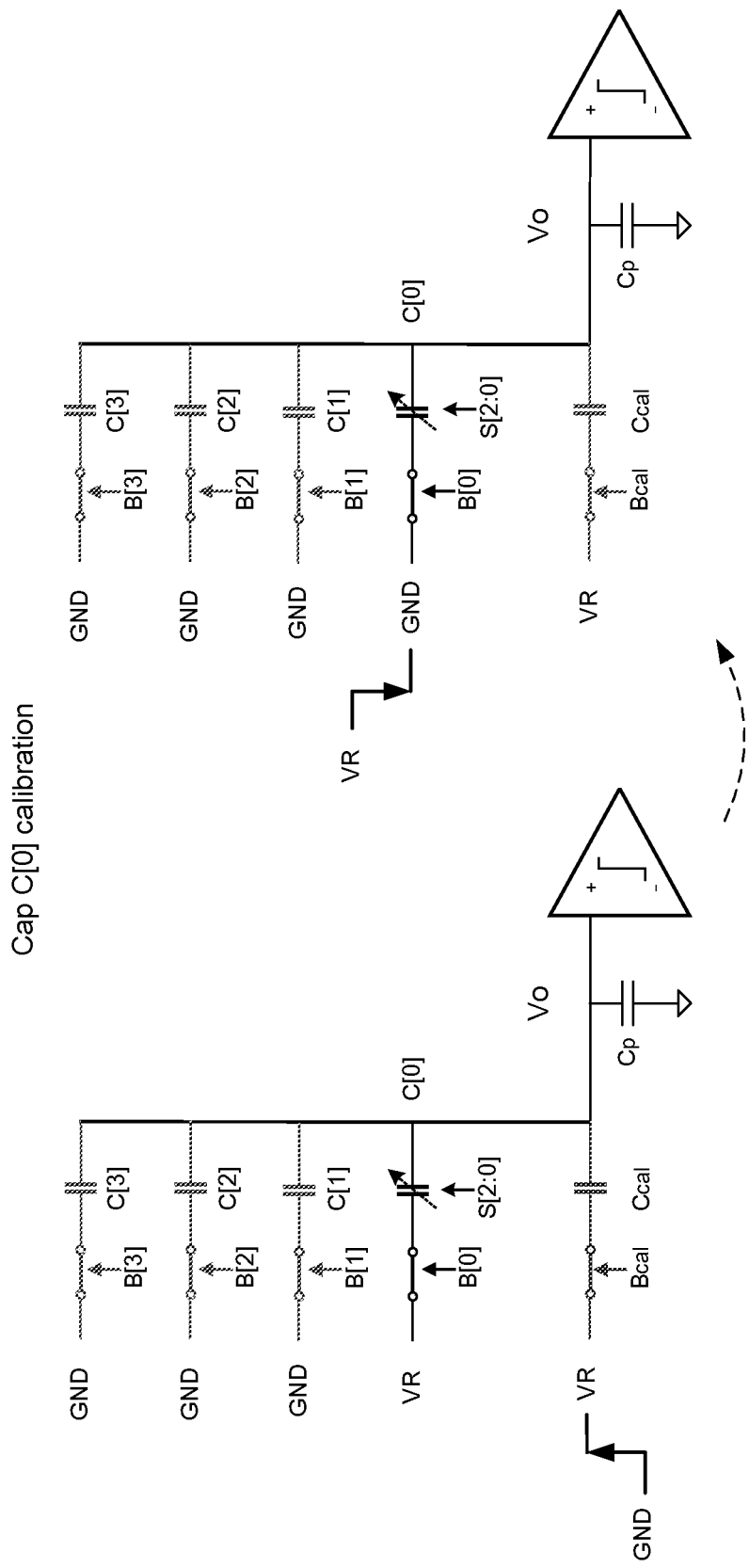
FIG. 6 shows LSB capacitor C[0] calibration of exemplary 4-bit capacitive DAC.
Figure 7:
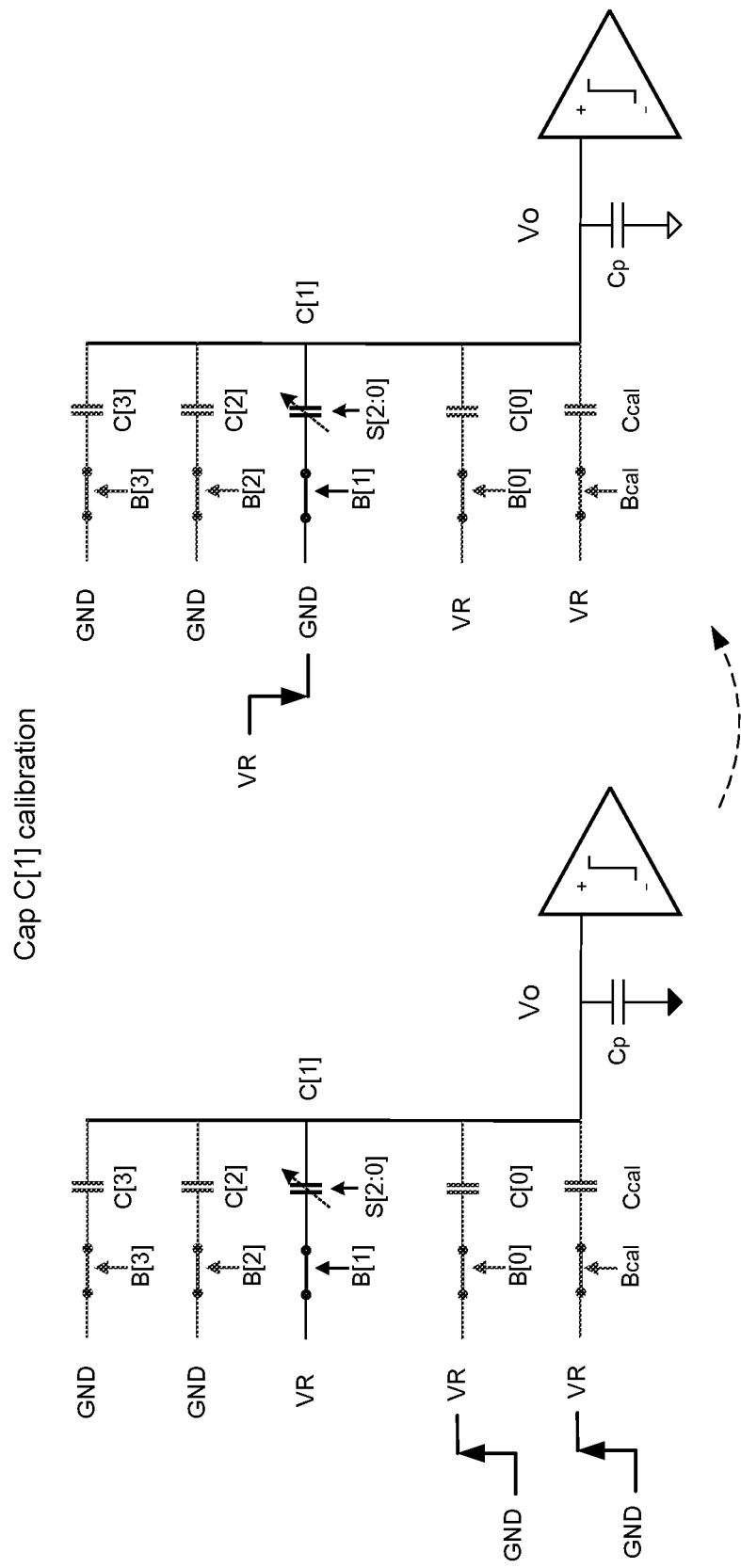
FIG. 7 illustrates capacitor C[1] calibration of exemplary 4-bit capacitive DAC.

Using the calibration method described above, 4-bit capacitor DAC calibration is illustrated below with detailed implementation on FIG. 4-9. Single end configuration is illustrated for simplicity, the actually implementation is in differential configuration for good common-mode rejection. FIG. 4 shows a 4-bit capacitor DAC of proposed capacitive DAC calibration process. It consists of primary four binary capacitors and four switches. Additional calibration capacitor $C_{cal}$ and associated switch are inserted to facilitate the calibration. The right ends of capacitors are all coupled together to a comparator. The binary capacitor C[3:0] and $C_{cal}$ can be coupled to VR, GND or $V_{IN}$ controlled by switch input B[3:0] and $B_{cal}$ respectively. The insertion of calibration capacitor $C_{cal}$ formulates a simple equation such that MSB capacitor value equals the sum of lower bits capacitor values Each capacitor consists of fixed-value capacitor $C_{base}$ and value-adjustable $C_{adj}$ as shown on FIG. 5(a). The total capacitor value is the sum of $C_{base}$ and $C_{adj}$. The capacitor calibration range and step is determined by the $C_{adj}$ value. FIG. 5(b) shows an exemplary implementation of capacitor C[3]. $C_{base}$ value is 6C and $C_{adj}$ can be adjusted from 0 to 3.5C controlled by registers S[2:0]. The step value of capacitor is 0.5C. The default capacitor value is $C_{base}$+$C_{adj}$=6C+2C=8C when S[2:0] is set to [100]; the maximum capacitor value is 6C+3.5C=9.5C and the minimum capacitance value is 6C. For this exemplary value, the calibration step is 0.5C/8C=6.25% and the calibration range is from +1.5C to −2C or +19% to −25% of the default capacitor value. The calibration range needs to cover the mismatch variation of the capacitor. The finer calibration step, the higher accuracy it obtains.

The ideal capacitor values of C[3:0] and $C_{cal}$ are 8C, 4C, 2C, 1C and 1C respectively. The capacitor value varies owing to mismatch of manufacture process. The calibration process checks the capacitor value and adjusts to ideal value. The calibration starts with LSB capacitor C[0] then move up to higher bits capacitors. The capacitor C[0] calibration step is illustrated on FIG. 6. Initially C[3:1] and $C_{cal}$ are set to default value. C[0] is set to its minimum value by programming S[2:0]=[000]. C[3:1] are connected to GND controlled by B[3:1], and C[0] is connected to VR. $C_{cal}$ is asserted from GND to VR to introduce a voltage increase ($C_{cal}/C_{total}$)*VR on the comparator input. Then C[0] is de-asserted from VR to GND. This results in the voltage change on the comparator input described as $$VR * \frac{C_{cal}}{C_{total}} - VR * \frac{C[0]}{C_{total}} \qquad (4)$$

Since C[0] is at its minimum value, the comparator output will be logic high when the capacitor mismatch is within the calibration range. Next C[0] is increased by one step with S[2:0] switching from [000] to [001]. Then comparator output is checked again to see if it trips from high to low. C[0] is increased in fine step sequentially until its value is larger than $C_{cal}$ and the comparator output switches from high to low. Capacitor C[0] calibration is finished once comparator output switches and the calibrated value S[2:0] value is stored. The strobe on comparator runs multiple times and the comparator output is averaged to avoid spontaneous error. After C[0] calibration is complete, the calibration process proceeds to capacitor C[1], this is illustrated on FIG. 7. C[3:2] are set to their default values and are connected to GND, C[1] is set to its minimum value and is connected to VR. C[0] and $C_{cal}$ are asserted from GND to VR then C[1] is de-asserted from VR to GND. This results in the voltage change on the comparator input described as:

$$VR * \frac{C[0] + C_{cal}}{C_{total}} - VR * \frac{C[1]}{C_{total}} \qquad (5)$$

Next C[1] value is increased incrementally by programming S[2:0] until comparator output trips from high to low. Once C[1] calibration is complete, C[1] calibrated value S[2:0] is stored and it can be read out for further analysis. If the comparator does not trip with C[1]'s maximum value S[2:0]=[111], C[1] will be set to its maximum value. This indicates the capacitor mismatch is greater than the calibration range, $C_{adj}$ range should be increased accordingly.

Figure 8:
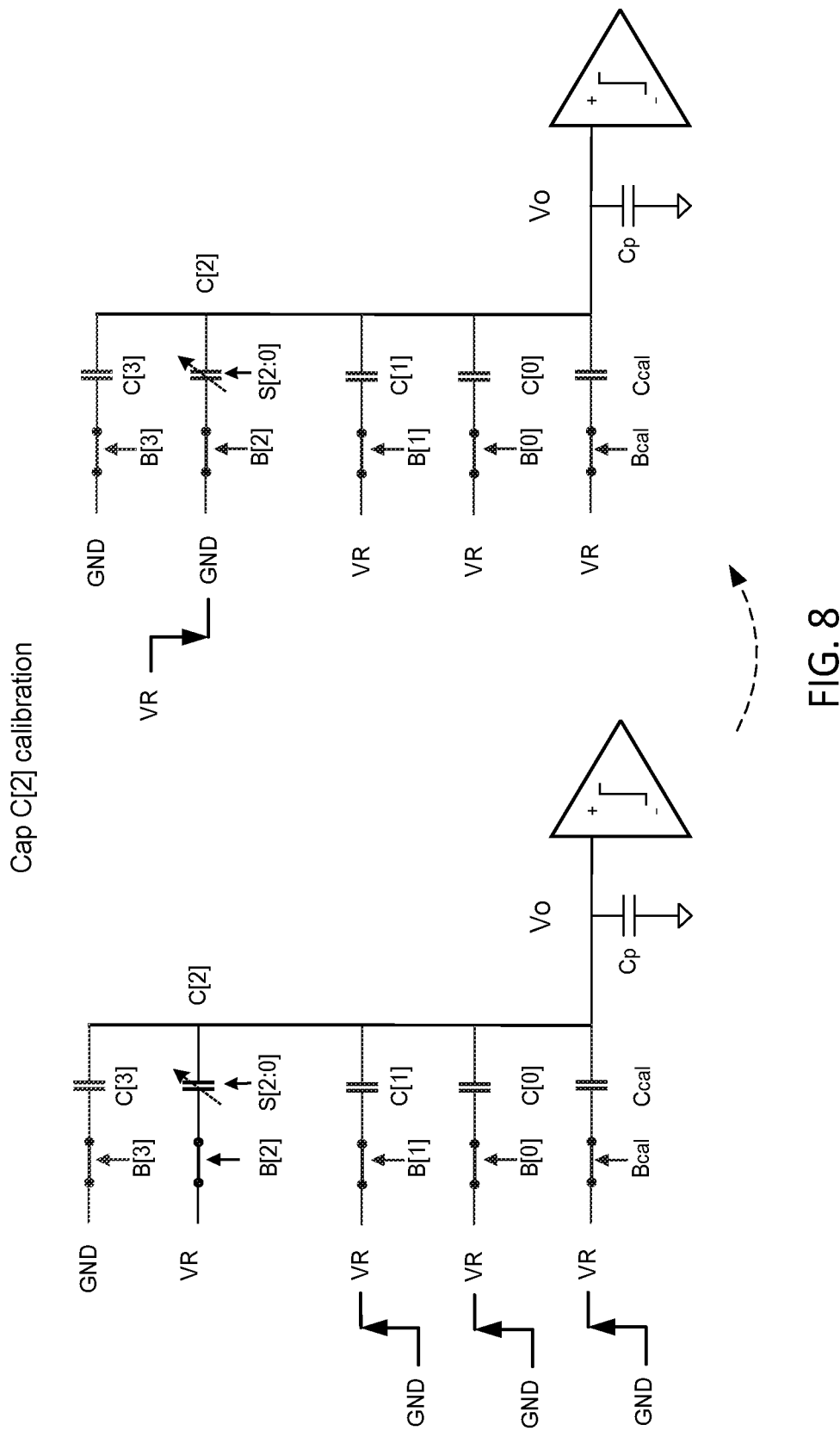
FIG. 8 illustrates capacitor C[2] calibration of exemplary 4-bit capacitive DAC.
Figure 9:
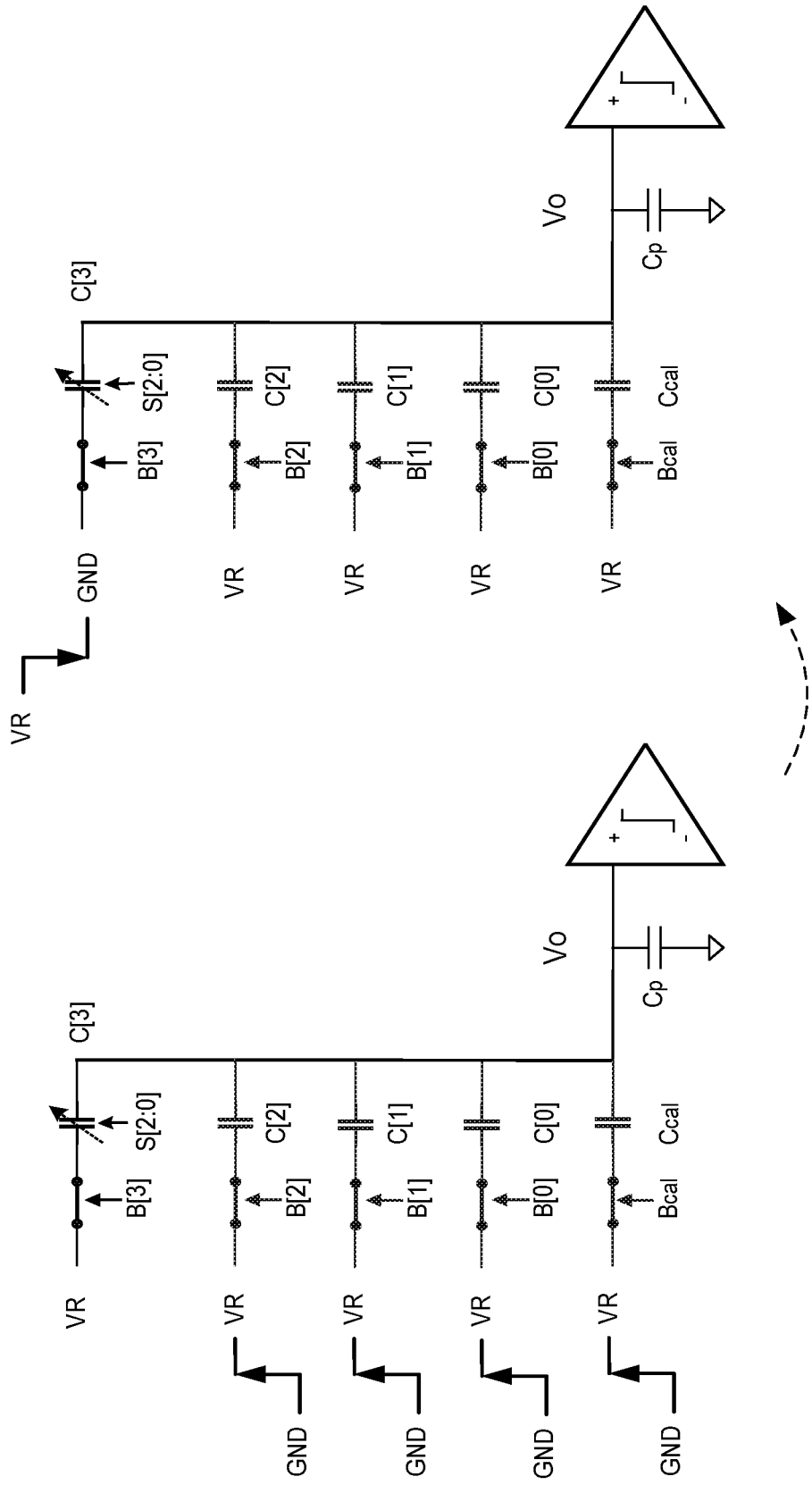
FIG. 9 illustrates MSB capacitor C[3] calibration of exemplary 4-bit capacitive DAC.

After C[0] and C[1] are calibrated, the process proceeds to calibrate capacitor C[2], which is illustrated on FIG. 8. C[3] is set to its default value and is connected to GND. C[2] is set to its minimum value and is connected to VR. The lower bit capacitors including C[1:0] and $C_{cal}$ are asserted from GND to VR. Then C[2] is de-asserted from VR to GND. This results in the voltage change on the comparator input as:

$$VR * \frac{C[1] + C[0] + C_{cal}}{C_{total}} - VR * \frac{C[2]}{C_{total}} \qquad (6)$$

C[2] value is then increased in step incrementally until comparator output trips from high to low. Next the process proceeds to calibrate MSB capacitor C[3]. This is illustrated on FIG. 9. C[3] is set to its minimum value and is connected to VR then all the lower bit capacitors C[2:0] and $C_{cal}$ are asserted from GND to VR. C[3] is de-asserted from VR to GND and comparator output is averaged. This introduces the voltage change on the comparator input as:

$$VR * \frac{C[2] + C[1] + C[0] + C_{cal}}{C_{total}} - VR * \frac{C[3]}{C_{total}} \qquad (7)$$

MSB capacitor C[3] is increased incrementally until comparator output trips. Four-bit capacitor DAC calibration is complete once MSB capacitor calibrated value is stored. The calibrated capacitor values can be read out to check if the calibration range covers the capacitor mismatch. The capacitor value can also be programmed by system to overwrite the calibrated values.

Figure 10:
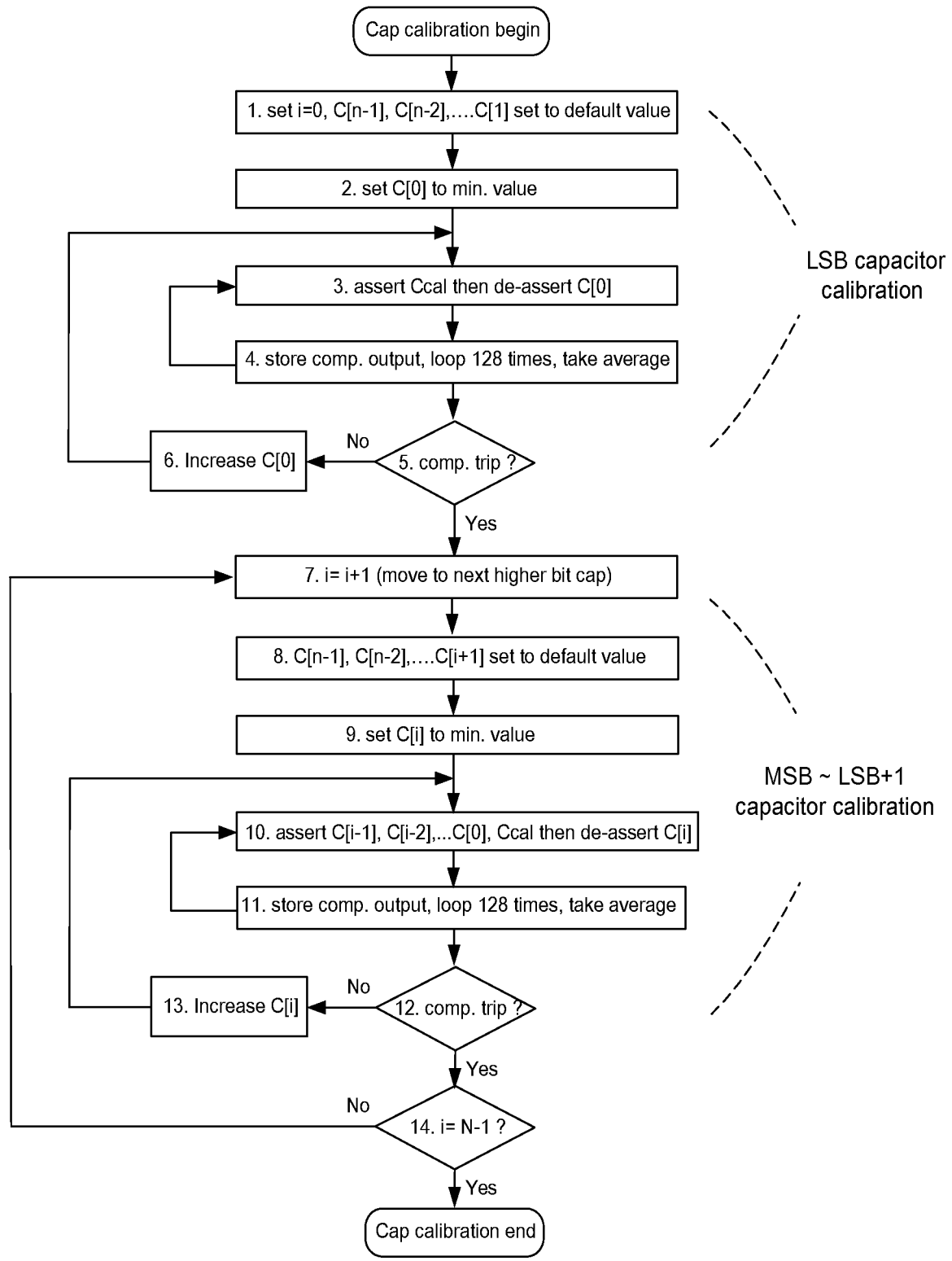
FIG. 10 is the procedure step of capacitive DAC calibration process.

FIG. 10 illustrates N-bit capacitor calibration process procedure step for N-bit SAR ADC. Each bit corresponds to one capacitor respectively and capacitor $C_{cal}$ is inserted additionally to facilitate the calibration. Therefore there are N+1 capacitors in total: C[n−1], C[n−2], C[n−3] . . . C[1], C[0] and $C_{cal}$. The process starts with LSB capacitor C[0] calibration from step 1 to 6. After LSB capacitor calibration is complete, the process proceeds to LSB+1 C[1] capacitor. It goes through the steps from step 7 to 14. Other capacitors also go through steps from 7 to 14 until MSB capacitor calibration is executed.

When capacitor C[i] is calibrated, the higher resolution bit capacitors C[n−1], C[n−2], . . . C[i+1] are set to default values and C[i] is set to its minimum value. The lower resolution bit capacitors C[i−1], C[i−2] . . . C[0] and $C_{cal}$ are asserted from GND to VR. Then C[i] is de-asserted from VR to GND. This leads to the voltage change on the comparator input described by the equation:

$$VR * \frac{C[i-1] + C[i-2] + \ldots + C[0] + C_{cal}}{C_{total}} - VR * \frac{C[i]}{C_{total}} \qquad (8)$$

This assertion and de-assertion by capacitors is executed for 128 times and the comparator output is averaged to avoid spontaneous error. The capacitor on calibration C[i] value is increased incrementally until the comparator output trips from high to low, which indicates that C[i] value is greater than the sum of the lower resolution capacitors C[i−1], C[i−2] . . . C[0] and $C_{cal}$. The calibration on capacitor C[i] is complete once comparator output switches polarity. Then the process proceeds to calibrate capacitor C[i+1] until all the capacitors calibration is finished.

Figure 11:
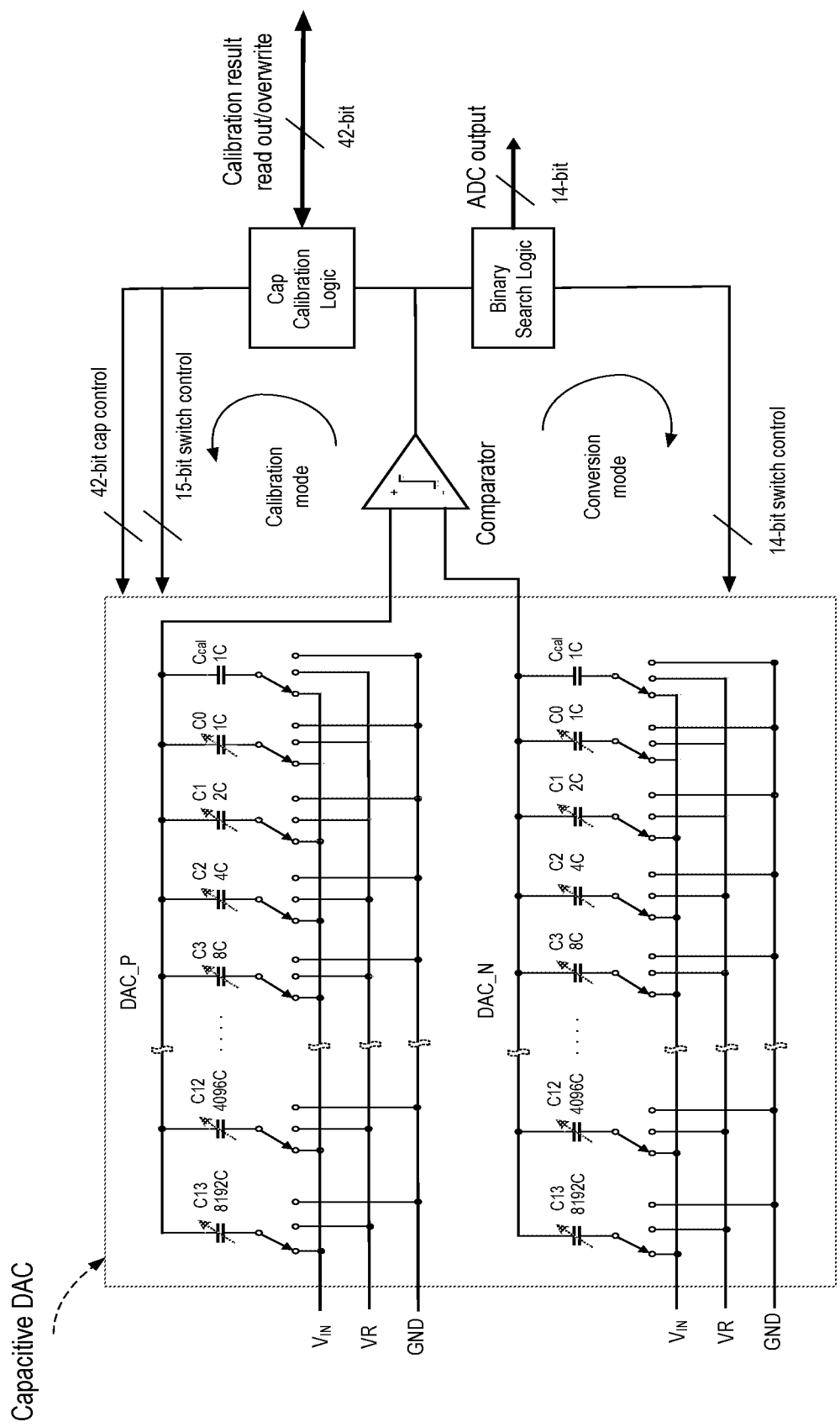
FIG. 11 shows the block diagram of 14-bit capacitive DAC calibrated SAR ADC.

FIG. 11 illustrates the block diagram of 14-bit capacitive DAC calibrated SAR ADC. It consists of capacitive DAC, comparator, Binary search logic and capacitor calibration logic. Capacitor calibration logic is a functional circuitry implemented based on the capacitive DAC calibration process. It is coupled to comparator and capacitive DAC. The capacitive DAC comprises 14-bit binary capacitors and additional inserted calibration capacitor $C_{cal}$. The capacitance of 14-bit binary capacitors can be adjusted.

There are two operation modes: calibration mode and conversion mode. The calibration mode is performed first to calibrate the capacitors before the conversion mode is executed. During capacitor calibration mode, the comparator output is directed to capacitor calibration logic. The calibration logic sends two signals to control capacitive DAC based on the averaged comparator output result. The 15-bit switch control is to assert or de-assert the 15-bit capacitor. The 42-bit capacitor control is to adjust the 14-bit capacitors wherein each capacitor has 2-bit control signals. The calibration outcome can be brought out for capacitor mismatch analysis and can also be overwritten by system.

Once the capacitor calibration is complete, capacitor calibration logic is disabled and the binary search logic is enabled to start conversion mode. The binary search logic takes comparator output and controls 14-bit capacitive DAC during conversion mode. The insertion of capacitor calibration logic does not modify any configuration of normal binary search conversion mode. The parasitic and non-ideal aspect of conversion mode such as offset, parasitic capacitance and resistance is well maintained and accounted by the calibration logic during calibration mode. The capacitor calibration logic doesn't need to reduce the clock rate and can operate at the same speed of conversion mode. This minimizes the circuitry difference between calibration mode and conversion mode.

By employing the capacitive DAC calibration process, the DAC capacitor value can be minimal since the mismatch of DAC capacitor can be corrected. The DAC settling and reference settling is improved with smaller capacitors and the power consumption can be reduced for the same conversion rate. SAR ADC achieves better performance and better Figure of Merit.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

What is claimed is:

1. A Successive Approximation Register Analog-to-Digital Converter (SAR ADC), comprising:
an ADC capacitive network coupled to a comparator;
a binary search logic coupled to the comparator, wherein the binary search logic applies a capacitive DAC two step calibration process to enhance SAR ADC linearity and performance, wherein a capacitor C[i] is calibrated by (a) setting high resolution bit capacitors C[n−1], C[n−2], . . . C[i+1] to default values and C[i] is set to a minimum value, and (b) asserting low resolution bit capacitors C[i−1], C[i−2] . . . C[0] and $C_{cal}$ from ground to a reference voltage VR and C[i] is de-asserted from VR to ground and wherein a comparator output comprises:

$$VR*C[i-1]+C[i-2]+ \ldots +C[0]+C_{cal}/C_{total} - VR*C[i]/C_{total}$$

wherein capacitor $C_{cal}$ is inserted to facilitate calibration, $C_{total}$ is total capacitance, and C[i] value is increased incrementally until the comparator output switches polarity.

2. The SAR ADC of claim 1, comprising a calibration capacitor $C_{cal}$ with the same least significant bit (LSB) capacitance value inserted into the capacitive DAC to facilitate the calibration and where an Nth-bit capacitor value equals a sum of lower bits capacitor values after a calibration capacitor.

3. The SAR ADC of claim 1, comprising a fixed-value base capacitor and a value-adjustable capacitor, the adjustable capacitor has a plurality of fine steps and determines the calibration range and calibration step.

4. The SAR ADC of claim 1, wherein capacitive DAC calibration process starts with a least significant bit (LSB) capacitor calibration and increments to higher bit capacitor sequentially until a most significant bit (MSB) capacitor is calibrated.

5. The SAR ADC of claim 1, comprising lower bit capacitors including C(N−1), C(N−2) . . . C[0] and $C_{cal}$ asserted from ground to VR then the capacitor C[N] on calibration is de-asserted from VR to ground, the voltage change on the comparator input represents the capacitance difference between these capacitors.

6. The SAR ADC of claim 1, comprising higher bit capacitors set to default values, the capacitor on calibration is set to its minimum value initially then increased incrementally until the comparator output trips from logic high to low during the calibration.

7. The SAR ADC of claim 5, wherein the assertion and de-assertion of capacitors is repeated multiple times and the comparator output is averaged for making the decision to avoid spontaneous error.

8. The SAR ADC of claim 1, wherein capacitor calibration logic is implemented based on the capacitive DAC calibration process and incorporated into SAR ADC, it is coupled to comparator and capacitive DAC; the configuration of normal binary search conversion is not changed.

9. The SAR ADC of claim 1, comprising two operation modes: calibration mode and conversion mode; the calibration mode is performed first before the conversion mode, wherein parasitic aspect and non-ideal characteristic of conversion mode is preserved during calibration mode.

10. The SAR ADC of claim 1, wherein the calibrated values for each capacitor of capacitive DAC calibration process can be brought out for mismatch analysis and be overwritten to obtain the optimal ADC performance.

11. A method to perform Successive Approximation Register (SAR) data conversion, comprising:
coupling an ADC capacitive network coupled to a comparator;
performing binary search using a comparator output using a two step capacitive DAC calibration process to enhance SAR ADC linearity and performance, wherein a capacitor C[i] is calibrated by (a) setting high resolution bit capacitors C[n−1], C[n−2], . . . C[i+1] to default values and C[i] is set to a minimum value, and (b) asserting low resolution bit capacitors C[i−1], C[i−2] . . . C[0] and $C_{cal}$ from ground to a reference voltage VR and C[i] is de-asserted from VR to ground and wherein a comparator output comprises:

$$VR*C[i-1]+C[i-2]+\ldots+C[0]+C_{cal}/C_{total}-VR*C[i]/C_{total}$$

wherein capacitor $C_{cal}$ is inserted to facilitate calibration, $C_{total}$ is total capacitance, and C[i] value is increased incrementally until the comparator output switches polarity.

12. The method of claim 11, wherein $C_{cal}$ with the same least significant bit (LSB) capacitance value is inserted into the capacitive DAC to facilitate the calibration and an Nth-bit capacitor value equals the sum of lower bits capacitor values after adding calibration capacitor.

13. The method of claim 11, wherein each capacitor of capacitive DAC comprises a fixed-value base capacitor and a value-adjustable capacitor, the adjustable capacitor has many fine steps and determines the calibration range and calibration step.

14. The method of claim 11, wherein capacitive DAC calibration process starts with the least significant bit (LSB) capacitor calibration then proceeds to higher bit capacitor sequentially until the most significant bit (MSB) capacitor is calibrated.

15. The method of claim 11, wherein lower bit capacitors including C(N−1), C(N−2) . . . C[0] and $C_{cal}$ are asserted from GND to VR then the capacitor C[N] on calibration is de-asserted from VR to ground, the voltage change on the comparator input represents the capacitance difference between these capacitors.

16. The method of claim 11, wherein the higher bit capacitors are set to default values, the capacitor on calibration is set to its minimum value initially then increased incrementally until the comparator output trips from logic high to low during the calibration.

17. The method of claim 15, wherein the assertion and de-assertion of capacitors is repeated multiple times and the comparator output is averaged for making the decision to avoid spontaneous error.

18. The method of claim 11, wherein capacitor calibration logic is implemented based on the capacitive DAC calibration process and incorporated into SAR ADC, it is coupled to comparator and capacitive DAC; the configuration of normal binary search conversion is not changed.

19. The method of claim 11, comprising two operation modes: calibration mode and conversion mode; the calibration mode is performed first before the conversion mode, wherein parasitic aspect and non-ideal characteristic of conversion mode is preserved during calibration mode.

20. The method of claim 11, wherein the calibrated values for each capacitor of capacitive DAC calibration process can be brought out for mismatch analysis and be overwritten to obtain the optimal ADC performance.

* * * * *